United States Patent
Liu et al.

(10) Patent No.: US 10,176,360 B2
(45) Date of Patent: Jan. 8, 2019

(54) ARRAY SUBSTRATE, DISPLAY PANEL AND DISPLAY APPARATUS HAVING THE SAME, AND DRIVING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yingming Liu, Beijing (CN); Xue Dong, Beijing (CN); Hailin Xue, Beijing (CN); Xiaochuan Chen, Beijing (CN); Xiaoliang Ding, Beijing (CN); Shengji Yang, Beijing (CN); Haisheng Wang, Beijing (CN); Rui Xu, Beijing (CN); Changfeng Li, Beijing (CN); Wei Liu, Beijing (CN); Pengpeng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/543,502

(22) PCT Filed: Sep. 27, 2016

(86) PCT No.: PCT/CN2016/100294
§ 371 (c)(1),
(2) Date: Jul. 13, 2017

(87) PCT Pub. No.: WO2018/010303
PCT Pub. Date: Jan. 18, 2018

(65) Prior Publication Data
US 2018/0211079 A1    Jul. 26, 2018

(30) Foreign Application Priority Data

Jul. 11, 2016    (CN) .......................... 2016 1 0543638

(51) Int. Cl.
*G06K 9/00* (2006.01)
*G06F 3/041* (2006.01)
*H01L 31/02* (2006.01)

(52) U.S. Cl.
CPC .......... *G06K 9/0002* (2013.01); *G06F 3/041* (2013.01); *H01L 31/02024* (2013.01); *G09G 2310/0278* (2013.01)

(58) Field of Classification Search
None
See application file for complete search history.

(56) References Cited

U.S. PATENT DOCUMENTS

2002/0190229 A1* 12/2002 Nakamura ......... G06K 9/00013
250/556
2005/0139751 A1    6/2005 Park et al.
(Continued)

FOREIGN PATENT DOCUMENTS

CN    105093611 A    11/2015
CN    105550662 A    5/2016
(Continued)

OTHER PUBLICATIONS

International Search Report & Written Opinion dated Apr. 27, 2017 regarding PCT/CN2016/100294.

*Primary Examiner* — Ryan P Potts
(74) *Attorney, Agent, or Firm* — Intellectual Valley Law, P.C.

(57) ABSTRACT

An array substrate includes a base substrate; an array of a plurality of pixel units on the base substrate, each pixel unit including at least one subpixel for image display, at least some of the plurality of pixel units including a semiconduc-
(Continued)

tor photodetector in at least one subpixel for detecting biometric information; a plurality of first scan lines for driving image display; a plurality of second scan lines, each second scan line being connected to a row of subpixels having the semiconductor photodetector in a row of pixel units; and a plurality of read lines, each read line being connected to each semiconductor photodetector in a column of subpixels having the semiconductor photodetector in a column of pixel units.

20 Claims, 10 Drawing Sheets

(56) References Cited

U.S. PATENT DOCUMENTS

| | | | | |
|---|---|---|---|---|
| 2007/0257259 | A1* | 11/2007 | Chen | G09G 3/3648 257/59 |
| 2008/0084366 | A1* | 4/2008 | Saito | G06F 3/0421 345/76 |
| 2008/0278667 | A1* | 11/2008 | Kobashi | G02F 1/13318 349/116 |
| 2009/0002341 | A1* | 1/2009 | Saito | G06F 3/0412 345/175 |
| 2009/0033850 | A1* | 2/2009 | Ishiguro | G02F 1/13338 349/116 |
| 2011/0069020 | A1* | 3/2011 | Kim | G06F 3/0412 345/173 |
| 2011/0102392 | A1* | 5/2011 | Fujioka | G02F 1/13338 345/207 |
| 2011/0216256 | A1* | 9/2011 | Lin | G02F 1/135 349/27 |
| 2012/0139866 | A1* | 6/2012 | Jung | G06F 3/0421 345/174 |
| 2013/0033471 | A1* | 2/2013 | Park | G06F 3/0412 345/207 |
| 2013/0162602 | A1* | 6/2013 | Nakagawa | H01L 27/14601 345/175 |

FOREIGN PATENT DOCUMENTS

| | | |
|---|---|---|
| CN | 105870105 A | 8/2016 |
| CN | 105930827 A | 9/2016 |
| CN | 106537313 A | 3/2017 |

* cited by examiner

ARRAY SUBSTRATE, DISPLAY PANEL AND DISPLAY APPARATUS HAVING THE SAME, AND DRIVING METHOD THEREOF

CROSS-REFERENCE TO RELATED APPLICATION

This application is a national stage application under 35 U.S.C. § 371 of International Application No. PCT/CN2016/100294 filed Sep. 27, 2016, which claims priority to Chinese Patent Application No. 201610543638.9, filed Jul. 11, 2016, the contents of which are incorporated by reference in the entirety.

TECHNICAL FIELD

The present invention relates to display technology, more particularly, to an array substrate, a display panel and a display apparatus having the same, and a driving method thereof.

BACKGROUND

In recent years, various methods have been proposed in fingerprint and palm print recognition. Examples of optical method for recognizing fingerprint and palm print include total reflection method, light-path, separation method, and scanning method. In a total reflection method, light from a light source such as ambient light enters into a pixel, and is totally reflected on the surface of a package substrate. When a finger or palm touches the display panel, the total reflection condition of the surface changes locally upon touch, leading to a disruption of the total reflection locally. The disruption of the total reflection results in a reduced reflection. Based on this principle, the ridge lines of a finger may be differentiated from the valley lines. Alternatively, fingerprint and palm print may be recognized by detecting changes in capacitance when a finger touches the display panel.

SUMMARY

In one aspect, the present invention provides an array substrate comprising a base substrate; an array of a plurality of pixel units on the base substrate, each pixel unit comprising at least one subpixel for image display, at least some of the plurality of pixel units comprising a semiconductor photodetector in at least one subpixel for detecting biometric information; a plurality of first scan lines for driving image display; a plurality of second scan lines, each second scan line being connected to a row of subpixels having the semiconductor photodetector in a row of pixel units; and a plurality of read lines, each read line being connected to each semiconductor photodetector in a column of subpixels having the semiconductor photodetector in a column of pixel units; wherein each subpixel comprises a first transistor for driving image display; each semiconductor photodetector comprises a first polarity region connected to a common electrode in a same subpixel, and a second polarity region connected to an electrode configured to provide a reset voltage signal to the second polarity region and a diode junction connecting the first polarity region and the second polarity region; and each subpixel having the semiconductor photodetector comprises a second transistor, the second transistor comprising a gate node connected to a corresponding second scan line, a first node connected to a corresponding read line, and a second node connected to the second polarity region directly, or indirectly through the electrode configured to provide the reset voltage signal.

Optionally, the electrode configured to provide the reset voltage signal is the second node of the second transistor; the semiconductor photodetector is on a side of the second node of the second transistor distal to the base substrate; a projection of the semiconductor photodetector in plan view of the array substrate is within a projection of the second node of the second transistor in a same subpixel.

Optionally, the electrode configured to provide the reset voltage signal is an electrode in a same layer as a pixel electrode in a same subpixel; the semiconductor photodetector is on a side of the electrode distal to the base substrate.

Optionally, each subpixel having the semiconductor photodetector further comprises a light shield layer on a side of the electrode proximal to the base substrate; and a projection of the semiconductor photodetector in plan view of the array substrate is within a projection of the light shield layer in a same subpixel.

Optionally, the plurality of first scan lines are configured to drive the plurality of pixel units row-by-row in a first time period; each first scan line in the first time period of each frame of image is configured to apply a first scan signal to each subpixel in the row of subpixels to allow a data signal be passed from a corresponding data line to the each subpixel to produce a subpixel of image based on the data signal; the plurality of second scan lines are configured to drive the plurality of pixel units row-by-row in a second time period; each second scan line in the second time period of each frame of image is configured to apply a second scan signal to each second transistor in the row of the subpixels to allow the reset voltage signal be passed from a corresponding electrode configured to provide the reset voltage signal to each semiconductor photodetector; the reset voltage signal being configured to set the second polarity region of the semiconductor photodetector at a high voltage level, the common electrode being configured to apply a common voltage signal to set the first polarity region of the semiconductor photodetector at a low voltage level, and the semiconductor photodetector being configured to be in a reversely biased state; the second time period being later in time than the first time period; and the plurality of second scan lines are configured to drive the plurality of pixel units row-by-row in a third time period; each second scan line in the third time period of each frame of image is configured to apply a third scan signal to each second transistor in the row of the subpixels to transmit a biometric signal from the each subpixel having the semiconductor photodetector to a corresponding read line; the third time period being later in time than the second time period.

Optionally, the plurality of second scan lines are configured to drive the plurality of pixel units simultaneously in an intermittent time period; the plurality of second scan lines in the intermittent time period of each frame of image are configured to apply a fourth scan signal to a plurality of second transistors in the plurality of pixel units simultaneously to transmit a plurality of biometric signals from the plurality of subpixels having the semiconductor photodetector to a plurality of corresponding read lines; a sum of the biometric signal from each read line being a cumulative biometric signal.

Optionally, the intermittent time period is earlier in time than the second time period.

Optionally, the plurality of second scan lines in the intermittent time period of each frame of image are configured to apply the fourth scan signal multiple times.

Optionally, each data line connected to a column of subpixels having the semiconductor photodetector is used a read line for the column of subpixels having the semiconductor photodetector in the third time period, and used a data line in the first time period.

Optionally, the semiconductor photodetector is a PN photodiode, the first polarity region is a P+ doping semiconductor region, and the second polarity region is an N+ doping semiconductor region.

Optionally, the semiconductor photodetector is a PIN photodiode, the first polarity region is a P+ doping semiconductor region, and the second polarity region is an N+ doping semiconductor region, the PIN photodiode further comprises an intrinsic region of amorphous silicon between the P+ doping semiconductor region and the N+ doping semiconductor region.

Optionally, each pixel comprises a subpixel region and an inter-subpixel region, the semiconductor photodetector is within the inter-subpixel region.

Optionally, each pixel comprises a subpixel region and an inter-subpixel region, a single semiconductor photodetector in each-pixel is configured to span over portions of inter-subpixel regions of at least two subpixels in each pixel.

Optionally, each pixel comprises a subpixel region and an inter-subpixel region, a single semiconductor photodetector in each pixel is configured to span over portions of inter-subpixel regions of all subpixels in each pixel.

In another aspect, the present invention provides a display panel comprising an array substrate described herein.

In another aspect, the present invention provides a display apparatus comprising a display panel described herein.

In another aspect, the present invention provides a method for driving an operation of an array substrate, comprising providing a plurality of first scan signals to the plurality of first scan lines row-by-row in a first time period of each frame of image; each first scan line in the first time period applies a first scan signal to each subpixel in the row of subpixels to allow a data signal be passed from a corresponding data line to the each subpixel to produce a subpixel of image based on the data signal; providing a plurality of second scan signals to the plurality of second scan lines row-by-row in a second time period of each frame of image and providing a common voltage signal to the common electrode; each second scan line in the second time period applies a second scan signal to each second transistor in the row of the subpixels to allow the reset voltage signal be passed from a corresponding electrode configured to provide the reset voltage signal to each semiconductor photodetector; the reset voltage signal sets the second polarity region of the semiconductor photodetector at a high voltage level, the common voltage signal sets the first polarity region of the semiconductor photodetector at a low voltage level, and the semiconductor photodetector is set to be in a reversely biased state; the second time period being later in time than the first time period; and providing a plurality of third scan signals to the plurality of second scan lines row-by-row in a third time period of each frame of image; each second scan line in the third time period applies a third scan signal to each second transistor in the row of the subpixels to transmit a biometric signal from the each subpixel having the semiconductor photodetector to a corresponding read line; the third time period being later in time than the second time period.

Optionally, providing a plurality of fourth scan signals to the plurality of second scan lines simultaneously in an intermittent time period; the plurality of second scan lines in the intermittent time period of each frame of image applies a fourth scan signal to a plurality of second transistors in the plurality of pixel units simultaneously to transmit a plurality of biometric signals from the plurality of subpixels having the semiconductor photodetector to a plurality of corresponding read lines; and generating a cumulative biometric signal from a sum of the biometric signal from each read line.

Optionally, the intermittent time period is earlier in time than the second time period.

Optionally, the method further comprises repeating the step of providing the plurality of fourth scan signals and the step of generating the cumulative biometric signal multiple times in the intermittent time period, thereby generating a plurality of cumulative biometric signals; and determining that a touch from a human user has occurred if a difference between at least two of the plurality of cumulative biometric signals is larger than a lower threshold value, and a difference between any two of the plurality of cumulative biometric signals does not exceed an upper threshold value.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
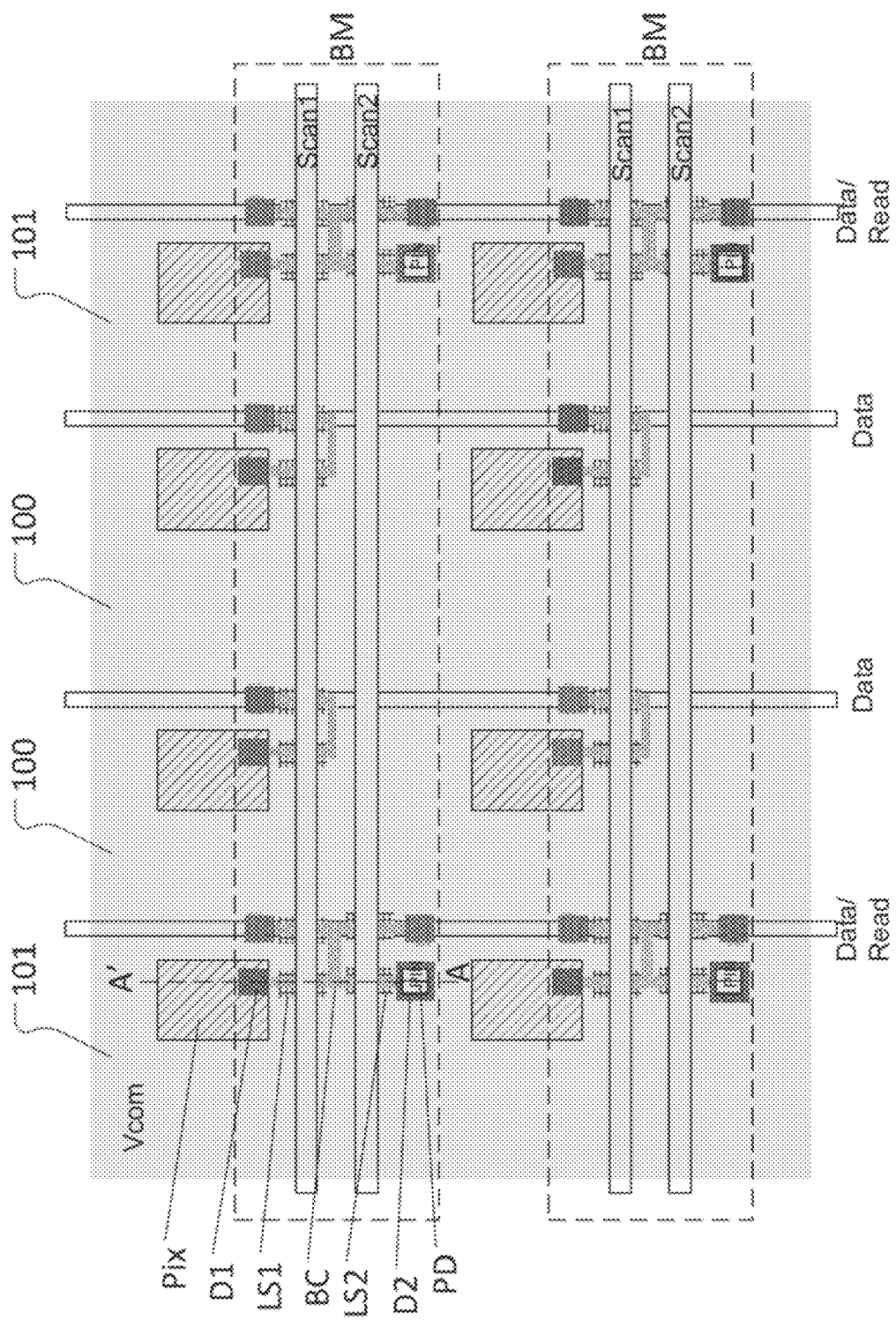
FIG. 1A is a diagram illustrating the structure of an array substrate in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present invention provides an improved array substrate for biometrics (e.g., fingerprint, palm print, or footprint) detection, a display panel and display apparatus having the same, and a driving method thereof. In some embodiments, the present array substrate includes a base substrate and an array of a plurality of pixel units on the base substrate. Each pixel unit in the present array substrate includes at least one (e.g., 3, 4, or morel subpixels for image display. At least some of the plurality of pixel units includes a semiconductor photodetector for detecting biometric information. Optionally, at least one subpixel of each of the plurality pixel units includes a semiconductor photodetector for detecting biometric information. Optionally, not every pixel unit includes a semiconductor photodetector, but only every one out of several pixel units include a semiconductor photodetector in at least one subpixel. In some embodiments, the semiconductor photodetector is a semiconductor photodetector having a diode junction. As used herein, the term diode junction refers to a junction that can exhibit current rectification, e.g., a junction that exhibits drastically different conductivities in one bias direction relative to the other.

Various appropriate semiconductor photodetectors having a diode junction may be utilized in making and using the present array substrate. Examples of semiconductor photodetectors having a diode junction include, but are not limited to, a PN photodiode, a PIN photodiode, an avalanche photodiode, a MIM diode junction, a MIS diode junction, a MOS diode junction, a SIS diode junction, and a MS diode junction.

In some embodiments, the semiconductor photodetectors having a diode junction includes a first polarity region, a second polarity region, and a diode junction connecting the first polarity region and the second polarity region. Optionally, the semiconductor photodetectors having a diode junction includes a first polarity region having a first dopant, a second polarity region having a second dopant, and a diode junction connecting the first polarity region and the second polarity region. Optionally, the semiconductor photodetectors having a diode junction is reversely biased when the first polarity region is connected to a low voltage and the second polarity region is connected to a high voltage. For example, the semiconductor photodetectors having a diode junction is in a reversely biased state when the first polarity region is connected to a common electrode (low voltage) and the second polarity region is connected to an electrode configured to provide the reset voltage signal (high voltage). In some embodiments, the semiconductor photodetectors having a diode junction is a PN junction having a P+ doping semiconductor region as the first polarity region and as N+ doping semiconductor region as the second polarity region. In some embodiments, the semiconductor photodetectors having a diode junction is a PIN photodiode having a P+ doping semiconductor region as the first polarity region, an N+ doping semiconductor region as the second polarity region, and an intrinsic region of amorphous silicon between the P+ doping semiconductor region and the N+ doping semiconductor region.

Each pixel of the present array substrate includes a subpixel region and an inter-subpixel region. In some embodiments, the semiconductor photodetector is within the inter-subpixel region. Optionally, a single semiconductor photodetector in each pixel spans over portions of inter-subpixel regions of at least two subpixels (e.g., 2, 3, 4 or more) in each pixel. Optionally, a single semiconductor photodetector in each pixel spans over portions of inter-subpixel regions of all subpixels in each pixel. Optionally, a single semiconductor photodetector in each pixel is substantially limited in an inter-subpixel regions of a single subpixel. As used herein, a subpixel region refers to a light emission region of a subpixel, such as a region corresponding to a pixel electrode in a liquid crystal, display or a region corresponding to a light emissive layer in an organic light emitting display. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

FIG. 1A is a diagram illustrating the structure of an array substrate in some embodiments. Referring to FIG. 1A, the array substrate in the embodiment includes an array of a plurality of pixel units on a base substrate. For example, FIG. 1A shows multiple pixel units, each of which includes three subpixels (100 or 101) for image display. One of the three subpixels, subpixel 101, further includes a semiconductor photodetector PD for detecting biometric information. The array substrate further includes a plurality of first scan lines Scan1 substantially along a first direction (row direction) and a plurality of data lines Data substantially along a second direction (column direction). The first direction and the second direction intersect each other for dividing the array substrate into a plurality of subpixels 100 and 101. Each first scan line Scan1 is connected to a row of subpixels, and each data line Data is connected to a column of subpixels.

The array substrate in FIG. 1A further includes a plurality of second scan lines Scan2 substantially along the first direction, e.g., substantially parallel to and spaced apart from the first scan lines Scan1. Each second scan line Scan2 is connected to a row of subpixels 101 having the semiconductor photodetector PD in a row of pixel units.

In some embodiments, the array substrate further includes a plurality of read lines for transmitting biometric signals from the semiconductor photodetectors PD. Each read line Read is connected to each semiconductor photodetector PD in a column of subpixels 101 having the semiconductor photodetector PD in a column of pixel units. As shown in FIG. 1A, the plurality of read lines Read may be a plurality of read lines Read/Data, i.e., the plurality of read lines Read are the same lines as the plurality of data lines Data for the column of subpixels 101 having the semiconductor photodetector PD in a column of pixel units. The plurality of read line Read/Data may be operated in a time-division mode, e.g., used as data lines Data in an image display mode, and used as read lines Read is a biometric signal detection mode. Optionally, the plurality of read lines Read may be separate lines distinct from the plurality of data lines.

Figure 1B:
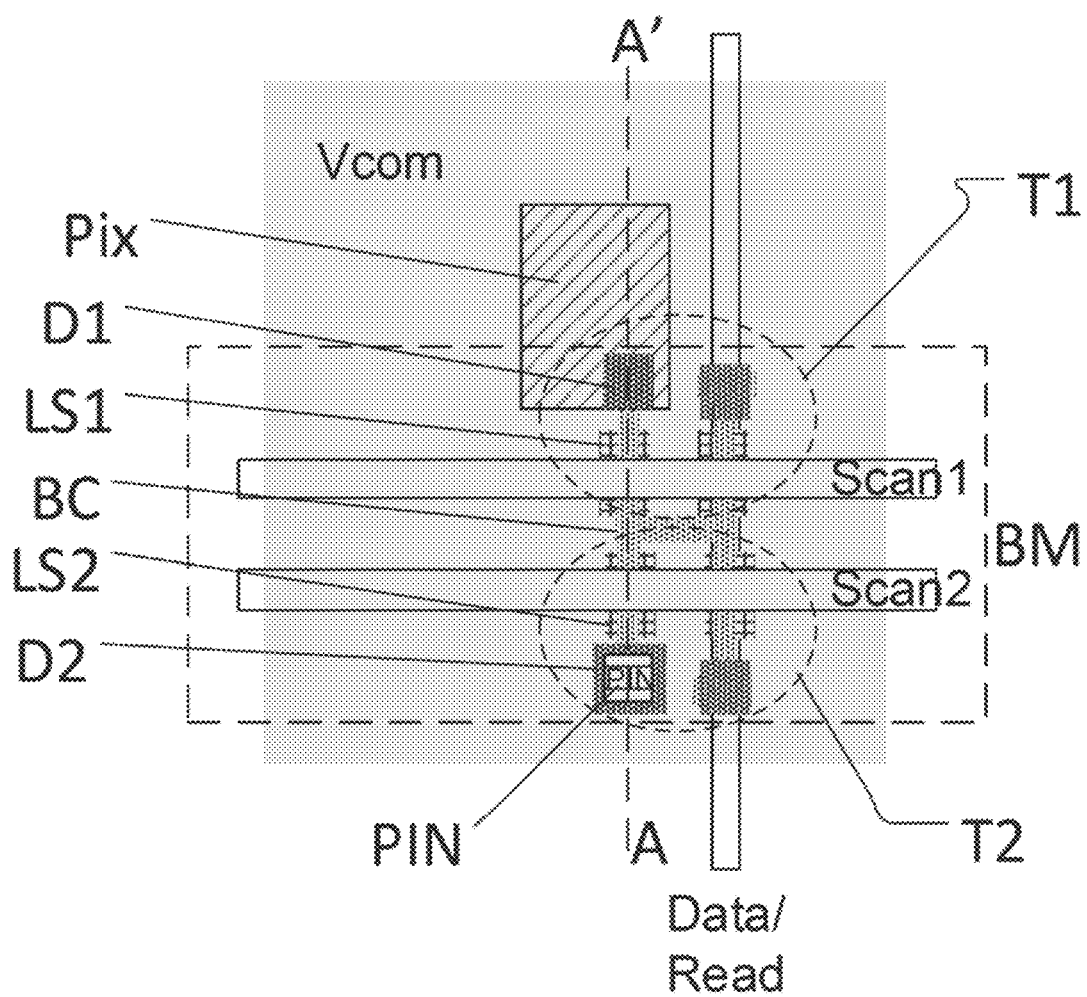
FIG. 1B is a zoom-in view of a subpixel of the array substrate of FIG. 1A.

FIG. 1B is a zoom-in view of a subpixel of the array substrate of FIG. 1A. Referring to FIG. 1B, the subpixel shown in FIG. 1B is a subpixel 101 having a semiconductor photodetector PD. The subpixel 101 includes a common electrode Vcom, a pixel electrode Pix, a first transistor T1, and a second transistor T2. A subpixel 100 not having the semiconductor photodetector PD includes a first transistor T1, but not the second transistor T2.

Figure 1C:
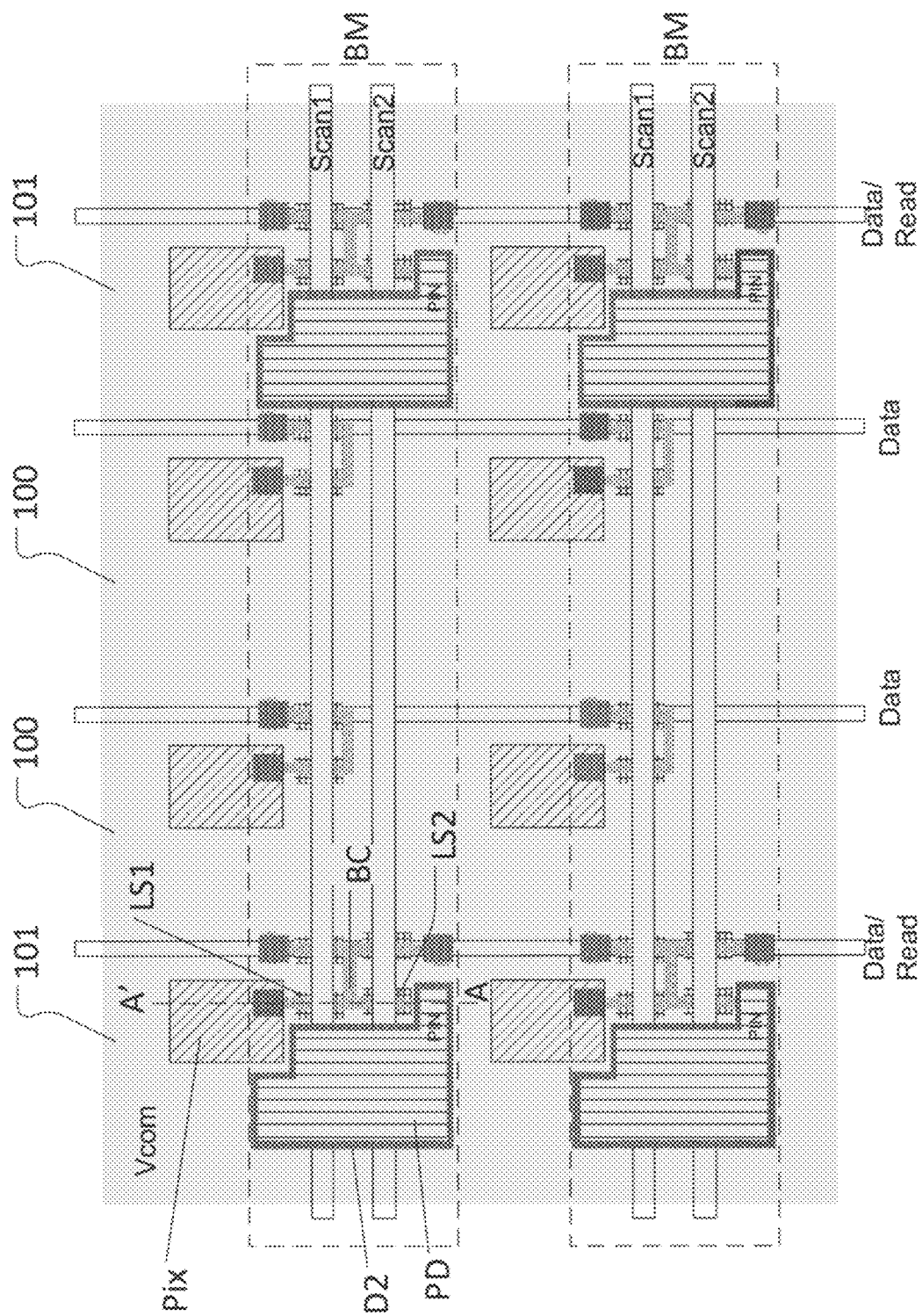
FIG. 1C is a diagram illustrating the structure of an array substrate in some embodiments.
Figure 1D:
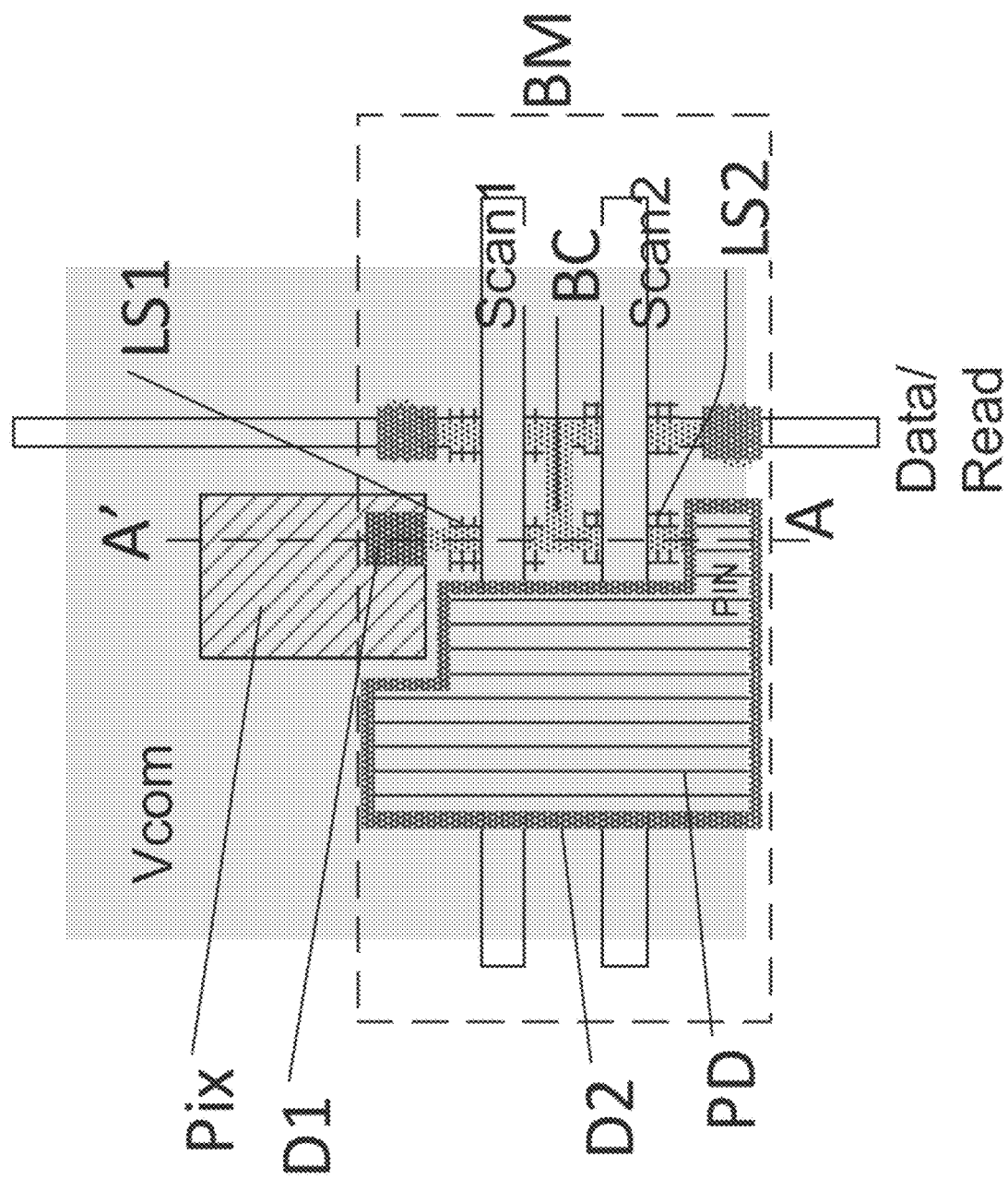
FIG. 1D is s zoom-in view of a subpixel of the array substrate of FIG. 1C.
Figure 1E:
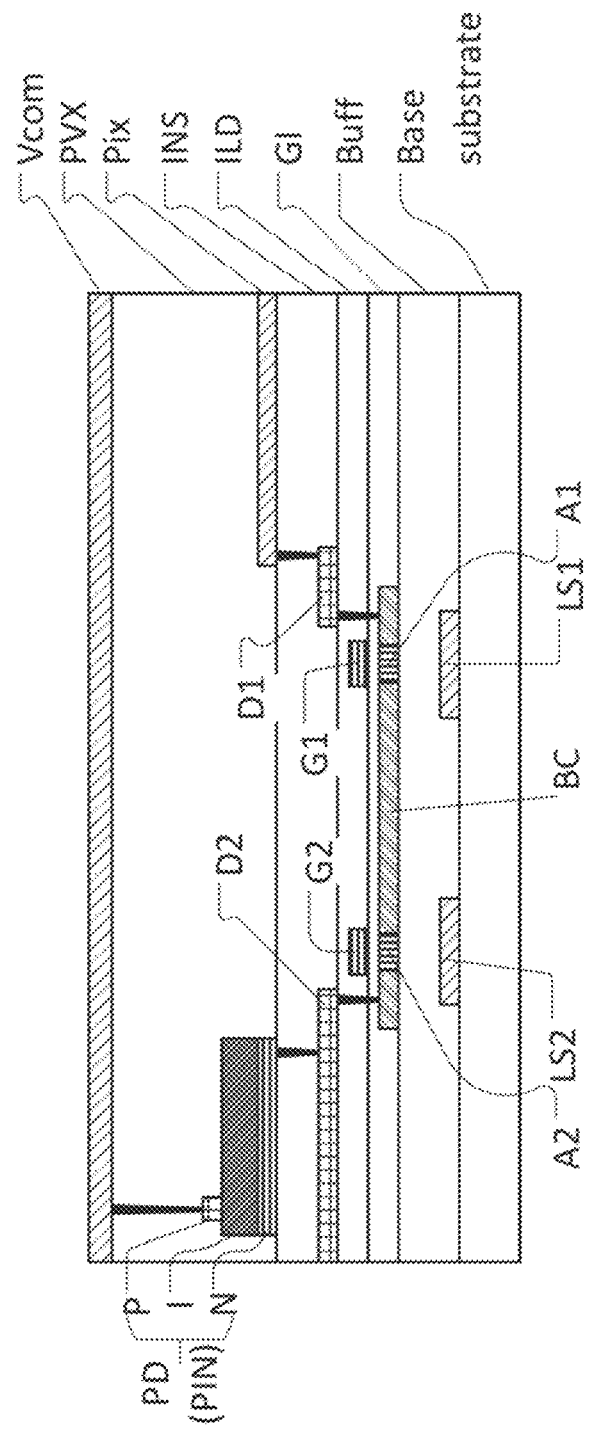
FIG. 1E is a cross-sectional view along A-A' line in FIGS. 1A-1D.

FIG. 1E is a cross-sectional view along A-A' fine in FIGS. 1A-1B. Referring to FIG. 1E, the first transistor T1 in the subpixel includes a first gate node G1, a first node (not shown), and a second node D1 (e.g., a drain electrode) connected to the pixel electrode Pix. The first gate node G1 of the first transistor T1 is connected to a corresponding first scan line (not shown in FIG. 1E). The first node of the first transistor T1 is connected to a corresponding data line (not shown in FIG. 1E).

Referring to FIG. 1E, the second transistor T2 includes a second gate node G2, a first node (not shown), and a second node D2. The second gate node G2 of the second transistor T2 is connected to a corresponding second scan line (not shown in FIG. 1E).

Various types of transistors may be used to make the present array substrate. For examples, one or both of the first transistor T1 and the second transistor T2 may be a double channel transistor (as shown in FIGS. 1A, 1B, and 1E).

In some embodiments, the semiconductor photodetector includes a first polarity region and a second polarity region, and a diode junction connecting the first polarity region and the second polarity region, as discussed hereinthroughout. Referring to FIG. 1E, the semiconductor photodetector PD in the embodiment is a PIN photodiode PIN. The PIN photodiode PIN includes a P+ doping semiconductor region P as the first polarity region and an N+ doping semiconductor region N as the second polarity region. Moreover, the PIN photodiode PIN includes an intrinsic region of amorphous silicon I between the P + doping semiconductor region P and the N+ doping semiconductor region N.

In some embodiments, the first polarity region is connected to the common electrode of a same subpixel, and the second polarity region is connected to an electrode configured to provide a reset voltage signal (e.g., a high voltage signal) to the second polarity region. Referring to FIG. 1E, the P+ doping semiconductor region P (the first polarity region) of the PIN photodiode PIN is connected to the common electrode Vcom, and the N+ doping semiconductor region N (the second polarity region) of the PIN photodiode PIN is connected to the second node D2 of the second transistor. Thus, in the array substrate as shown in FIG. 1E, the second node D2 of the second transistor is used as the electrode configured to provide the reset voltage signal to the second polarity region (the N+ doping semiconductor region N) of the PIN photodiode PIN. The common electrode provides a fixed low voltage signal to the P+ doping semiconductor region P, and the second node D2 provides a high voltage signal to the N+ doping semiconductor region N.

In some embodiments, the semiconductor photodetector is disposed between the common electrode and the second node of the second transistor. For example, the semiconductor photodetector may be disposed on a side of the second node of the second transistor distal to the base substrate, and on a side of the common electrode proximal to the base substrate.

The second node of the second transistor is made of a non-transparent metal material, thus serving as a light shield layer for shielding the semiconductor photodetector from light emitted from the backlight. As shown in FIG. 1E, a projection of the semiconductor photodetector PD in plan view of the array substrate is within a projection of the second node D2 of the second transistor in a same subpixel. The light from a backlight module can be blocked before it reaches the semiconductor photodetector PD. Various appropriate materials may be used for making the non-transparent second node D2. Optionally, the non-transparent second node D2 is made of a non-transparent conductive material.

The areas of the semiconductor photodetector and the second node may be increased to increase the photosensitivity of the semiconductor photodetector. FIG. 1C is a diagram illustrating the structure of an array substrate in some embodiments. FIG. 1D is a zoom-in view of a subpixel of the array substrate of FIG. 1C. Referring to FIGS. 1C and 1D, the semiconductor photodetector PD and the second node D2 extend substantially throughout the intersubpixel region (e.g., the black matrix region BM in FIGS. 1C and 1D) of the subpixel 101. Because the array substrate in FIGS. 1C and 1D uses the second node of the second transistor as the electrode configured to provide the reset voltage signal, the semiconductor photodetector and the second node cannot extend into the intersubpixel region of an adjacent subpixel 100 in a same row of subpixels.

Referring to FIG. 1E, the array substrate in the embodiment includes a Base substrate, a first light shield layer LS1 and a second light shield layer LS2 on the Base substrate. The first light shield layer LS1 shields the first active layer A1 of the first transistor from light emitted from the backlight module. The second light shield layer LS2 shields the second active layer A2 of the second transistor from light emitted from the backlight module. The array substrate further includes a buffer layer Buff on a side of the first light shield layer LS1 and the second light shield layer LS2 distal to the Base substrate; the first active layer A1, the second active layer A2, and a back channel layer BC on a side of the buffer layer Buff distal to the Base substrate, the first active layer A1, the second active layer A2, and the back channel layer BC in a same layer. The array substrate further includes a gate insulating layer GI on a side of the first active layer A1, the second active layer A2, and the back channel layer BC distal to the buffer layer Buff, a first gate node G1 and a second gate node G2 on a side of the gate insulating layer GI distal to the buffer layer Buff. As shown in FIG. 1E, the array substrate further includes an interlayer dielectric layer ILD on a side of the gate insulating layer GI distal to the buffer layer Buff, a second node D1 of the first transistor and a second node D2 of the second transistor on a side of the interlayer dielectric layer ILD distal to the gate insulating layer GI, an insulating layer INS on a side of the second node D1 and the second node D2 distal to the interlayer dielectric layer ILD, a pixel electrode Pix and a semiconductor photodetector PD on a side of the insulating layer INS distal to the interlayer dielectric layer ILD, a passivation layer PVX on a side of the pixel electrode Pix and the semiconductor photodetector PD distal to the insulating layer INS, and a common electrode Vcom on a side of the passivation layer PVX distal to the insulating layer INS. Optionally, the pixel electrode Pix and the semiconductor photodetector PD are in a same layer. The N+ doping semiconductor region (the second polarity region) of the semiconductor photodetector PD is connected to the second node D2 of the second transistor through a via, the P+ doping semiconductor region (the first polarity region) of the semiconductor photodetector PD is connected to the common electrode Vcom through another via.

Figure 2A:
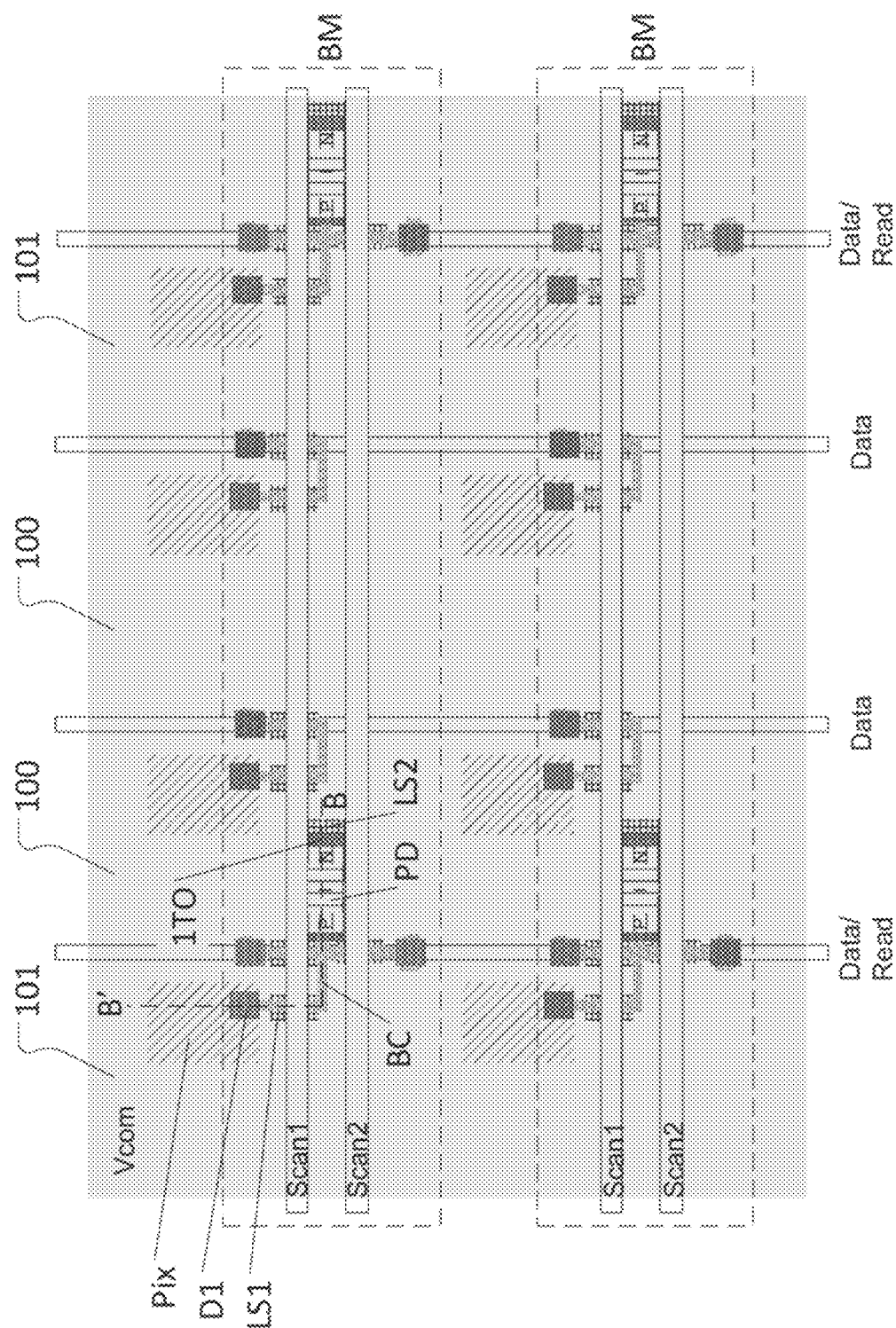
FIG. 2A is a diagram illustrating the structure of an array-substrate in some embodiments.
Figure 2B:
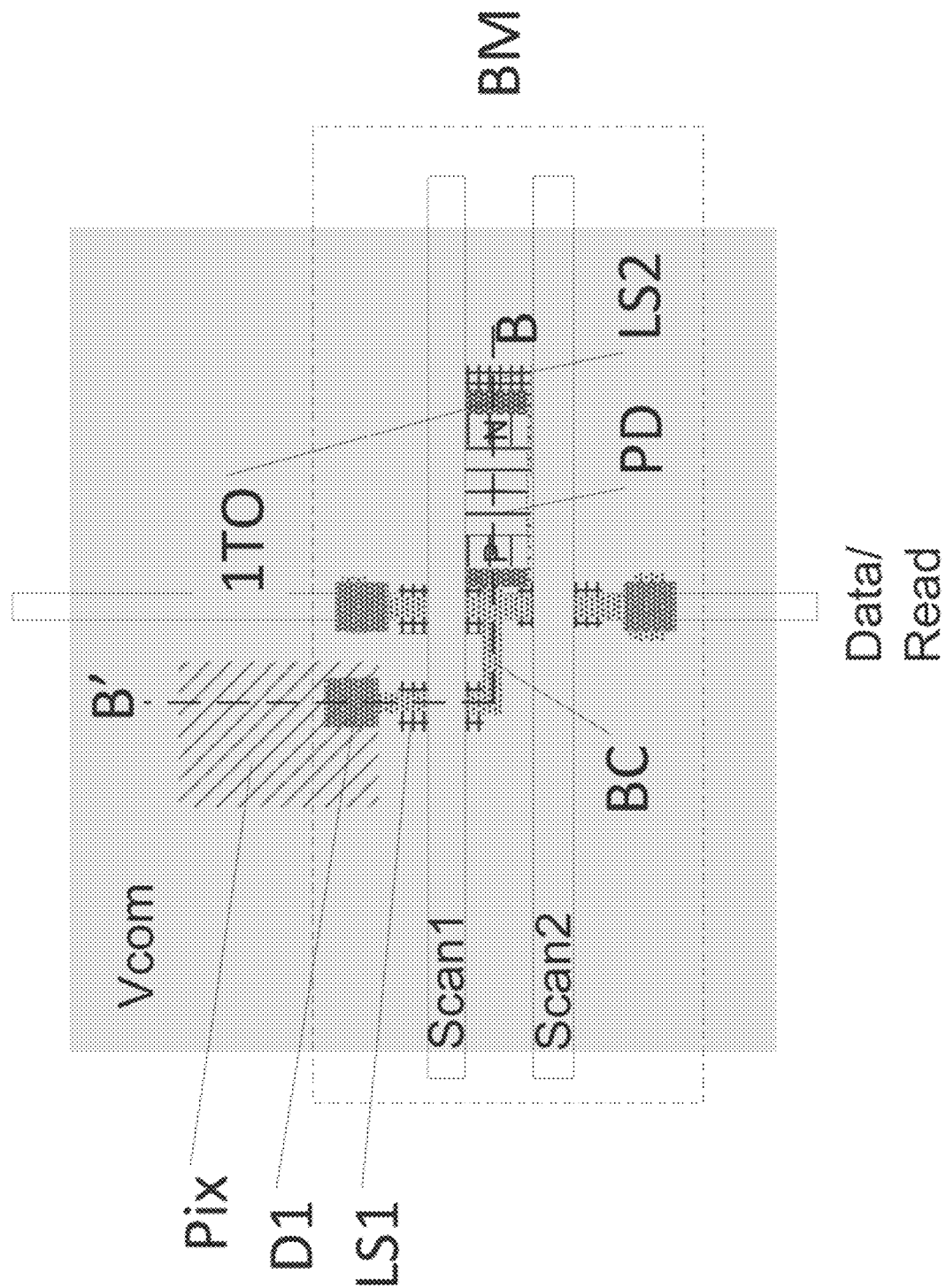
FIG. 2B is a zoom-in view of a subpixel of the array substrate of FIG. 2A.

In some embodiments, the electrode configured to provide the reset voltage signal is an electrode in a same layer as the pixel electrode, the semiconductor photodetector is on a side of the electrode distal to the base substrate. FIG. 2A is a diagram illustrating the structure of an array substrate in some embodiments. FIG. 2B is a zoom-is view of a subpixel of the array substrate of FIG. 2A. Referring to FIGS. 2A and 2B, the array substrate in the embodiment has a basic structure similar to those is FIGS. 1A-1E, except that the second node of the second transistor is not used as the electrode configured to provide the reset voltage signal. In the array substrate as shown in FIGS. 2A and 2B, an electrode ITO is used as the electrode configured to provide the reset voltage signal.

In some embodiments, the electrode ITO is a transparent electrode. To shield the semiconductor photodetector from light emitted from the backlight, the array substrate further includes a light shield layer LS2 on a side of the electrode ITO distal to the semiconductor photodetector PD, e.g., on a side of the electrode ITO proximal to the Base substrate. Optionally, a projection of the semiconductor photodetector PD in plan view of the array substrate is within a projection of the light shielding layer LS2 in a same subpixel.

Figure 2C:
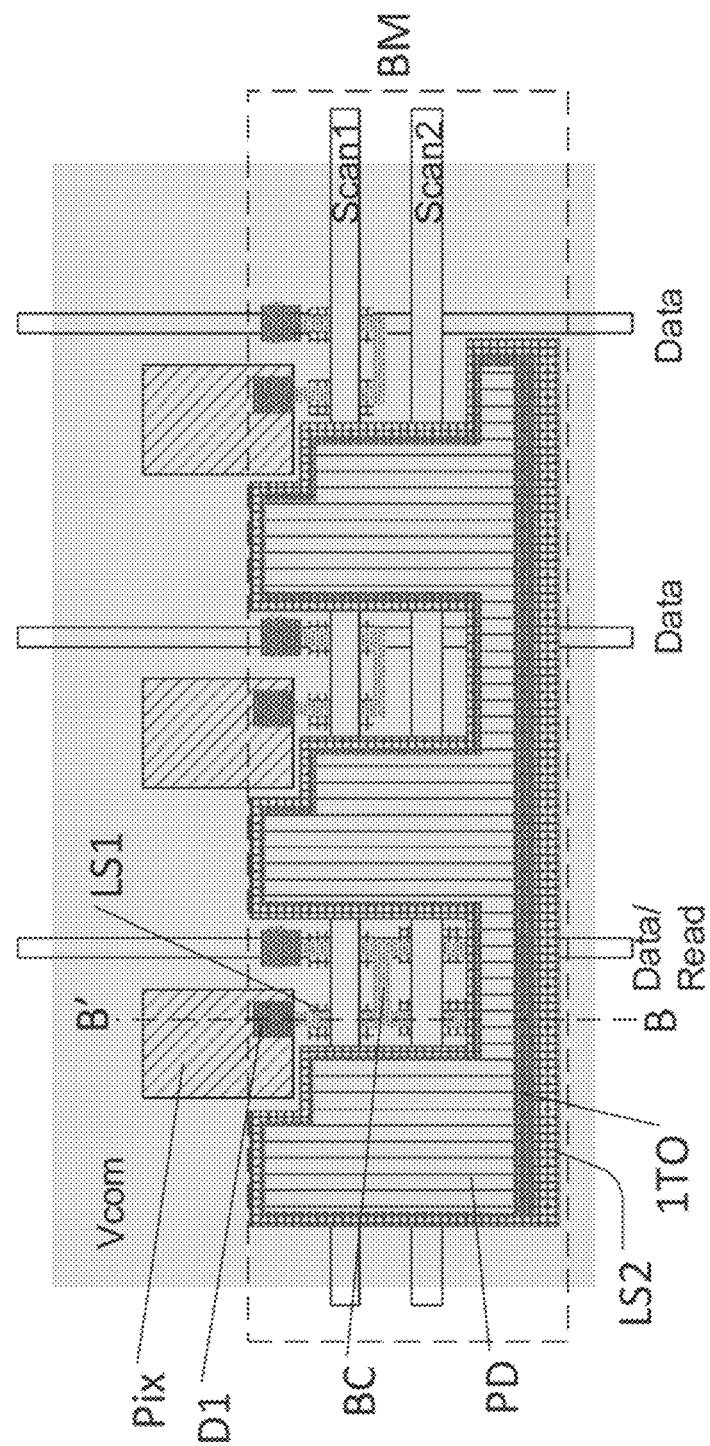
FIG. 2C is a diagram illustrating the structure of an array substrate in some embodiments.
Figure 2D:
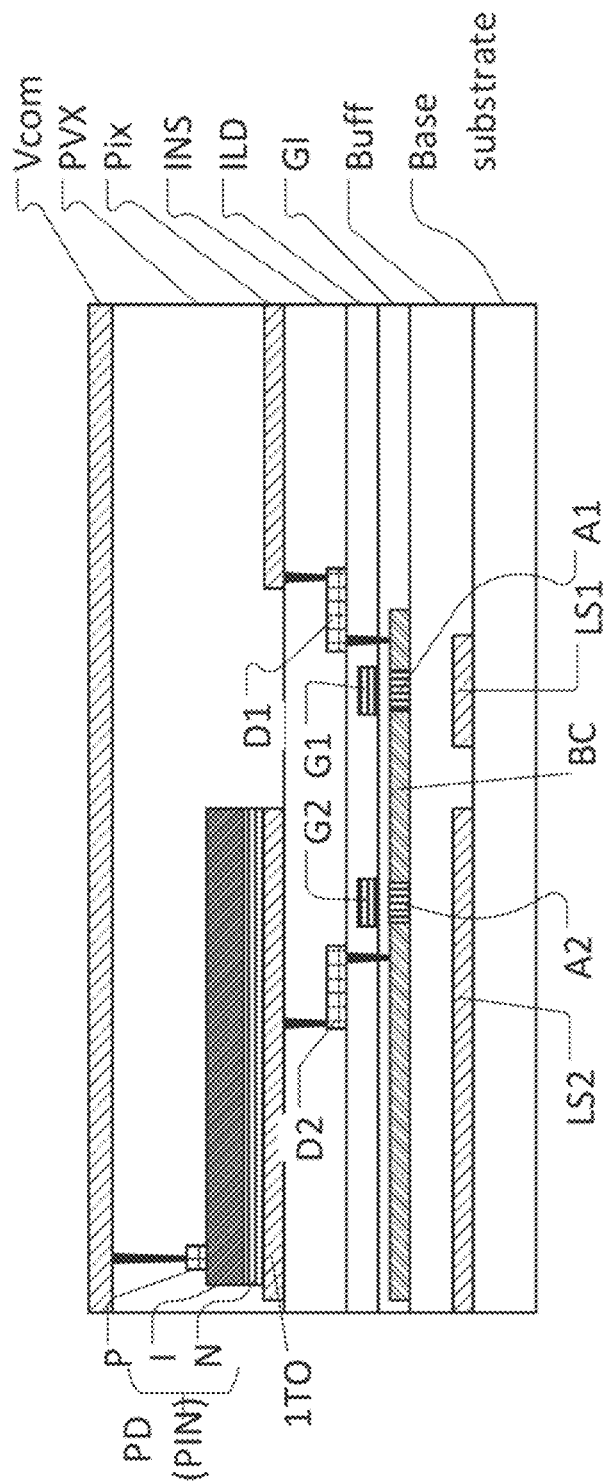
FIG. 2D is a cross-sectional view along B-B' line in FIGS. 2A-2C.

FIG. 2D is a cross-sectional view along B-B' line in FIGS. 2A-2B. Referring to FIG. 2D, the array substrate in the embodiment includes a Base substrate, a first light shield layer LS1 and a second light shield layer LS2 on the Base substrate. The first light shield layer LS1 shields the first active layer A1 of the first transistor from light emitted from the backlight module. The second light shield layer LS2 shields the second active layer A2 of the second transistor from light emitted from the backlight module. Moreover, the second light shield layer LS2 in the embodiment shield the semiconductor photodetector PD from light emitted from the backlight module. The array substrate further includes a buffer layer Buff on a side of the first light shield layer LS1 and the second light shield layer LS2 distal to the Base substrate; the first active layer A1, the second active layer A2, and a back channel layer BC on a side of the buffer layer Buff distal to the Base substrate, the first active layer A1, the second active layer A2, and the back channel layer BC in a same layer. The array substrate further includes a gate insulating layer GI on a side of the first active layer A1, the second active layer A2, and the back channel layer BC distal to the buffer layer Buff, a first gate node G1 and a second gate node G2 on a side of the gate insulating layer GI distal to the buffer layer Buff. As shown in FIG. 2D, the array substrate further includes an interlayer dielectric layer ILD on a side of the gate insulating layer GI distal to the buffer layer Buff, a second node D1 of the first transistor and a second node D2 of the second transistor on a side of the interlayer dielectric layer ILD distal to the gate insulating layer GI, an insulating layer INS on a side of the second node D1 and the second node D2 distal to the interlayer dielectric layer ILD, a pixel electrode Pix and an electrode ITO configured to provide the reset voltage signal on a side of the insulating layer INS distal to the interlayer dielectric layer ILD, a semiconductor photodetector PD on a side of the electrode ITO distal to the insulating layer INS, a passivation layer PVX on a side of the pixel electrode Pix and the semiconductor photodetector PD distal to the insulating layer INS, and a common electrode Vcom on a side of the passivation layer PVX distal to the insulating layer INS. Optionally, the pixel electrode Pix and the electrode ITO configured to provide the reset voltage signal are in a same layer. The N+ doping semiconductor region (the second polarity region) of the semiconductor photodetector PD is connected to the electrode ITO. Optionally, the electrode ITO is connected to the second node D2 of the second transistor through a via, the P+ doping semiconductor region (the first polarity region) of the semiconductor photodetector PD is connected to the common electrode Vcom through another via.

The areas of the semiconductor photodetector and the second node may be increased to increase the photosensi-tivity of the semiconductor photodetector. FIG. 2C is a diagram illustrating the structure of an array substrate in some embodiments. Referring to FIG. 2C, the semiconductor photodetector PD, the electrode ITO, and the second light shield layer LS2 span over portions of inter-subpixel regions of all subpixels in each pixel. Optionally, the semiconductor photodetector PD, the electrode ITO, and the second light shield layer LS2 extend substantially throughout the inter-subpixel regions (e.g., the black matrix region BM in FIG. 2C) of all subpixels in each pixel. Because the array substrate in FIG 2C uses an electrode ITO in a same layer as the pixel electrode Pix as the electrode for providing the reset voltage signal to the semiconductor photodetector, the semiconductor photodetector PD and the electrode ITO may extend into the intersubpixel regions of adjacent subpixels in a same pixel unit.

In some embodiments, the plurality of first scan lines, the plurality of second scan lines, and the plurality of read lines are configured to drive the plurality of pixel units row-by-row. For example, the array substrate may be operated in a time-division driving mode for detecting biometric information. The time-division driving mode may include a display mode and a biometric information detection mode. Optionally, each frame of image includes a plurality of time periods, e.g., a first time period, a second time period, a third time period, and an intermittent time period. In the first time period, each first scan line is configured to apply a first scan signal to each subpixel in the row of subpixels, allowing a data signal be passed from a corresponding data line to the each subpixel to produce a subpixel of image based on the data signal. In the second time period, each second scan line is configured to apply a second scan signal to each second transistor in the row of the subpixels, allowing the reset voltage signal be passed from a corresponding electrode configured to provide the reset voltage signal to each semiconductor photodetector. The reset voltage signal is configured to set the second polarity region of the semiconductor photodetector at a high voltage level. Meanwhile, the common electrode is configured to apply a common voltage signal to set the first polarity region of the semiconductor photodetector at a low voltage level. The semiconductor photodetector is configured to be in a reversely biased state by the reset voltage signal and the common voltage signal. Optionally, the second time period is later in time than the first time period. In the third time period, each second scan line is configured to apply a third scan signal to each second transistor in the row of the subpixels to transmit a biometric signal from the each subpixel having the semiconductor photodetector to a corresponding read line. Optionally, the third time period is later in time than the second time period.

Specifically, each first scan line in a first time period is configured to apply a first scan signal to each subpixel in the row of subpixels to switch on a corresponding first transistor, allowing a data signal be passed from a corresponding data line to a corresponding pixel electrode to produce a subpixel of image based on the data signal. In the second time period, each second scan line is configured to apply a second scan signal to each subpixel having the semiconductor photodetector in the row of subpixels to switch on a corresponding second transistor, allowing a reset voltage signal be passed from a corresponding electrode configured to provide the reset voltage signal to each semiconductor photodetector. Optionally, the second time period is later in time than the first time period. In the third time period, each second scan line is configured to application a third scan signal to each subpixel having the semiconductor photodetector in the row of subpixels to switch on a corresponding second transistor, allowing a biometric signal from the each subpixel having the semiconductor photodetector to be passed to a corresponding read line. Optionally, the third time period is later in time than the second time period.

In some embodiments, the time-division driving mode further includes an intermittent time period for determining whether a touch from a human user has occurred. Optionally, the intermittent time period is earlier than in time than the second time period and the third time period. Optionally, if it is determined that a touch from a human user has not occurred, e.g., the touch is not caused by a human body part, the second time period and the third time period are omitted in the frame of image. For example, the time-division driving mode in a frame of image only include the second time period and the third time period if it is determined in the intermittent time period of the frame of image that a touch from a human user has occurred.

Specifically, in the intermittent time period, the plurality of second scan lines are configured to drive the plurality of pixel units simultaneously, i.e., the plurality of second scan lines are configured to apply a fourth scan signal to a plurality of second transistors in the array of the plurality of pixel units simultaneously to switch on a plurality of corresponding second transistor, allowing a plurality of biometric signals from the plurality of subpixels having the semiconductor photodetectors to be passed simultaneously to a plurality of corresponding read lines. A sum of the biometric signal from each read line is a cumulative biometric signal. Optionally, the plurality of second scan lines in the intermittent time period of each frame of image are configured to apply the fourth scan signal multiple times to generate a plurality of cumulative biometric signals.

Optionally, each pixel unit includes a red subpixel, a green subpixel, and a blue subpixel, wherein the blue subpixel includes the semiconductor photodetector.

The semiconductor photodetector (e.g., a PN photodiode or a PIN photodiode) described herein is capable of identifying various biometric information (e.g., a fingerprint, a palm print, or a footprint) based on light refraction and reflection principle. When a finger (or a palm or a foot) touches the surface of a display panel having the present array substrate, light emitted from each subpixel irradiates on the valley lines and ridge lines of the finger, partly retracts and partly reflects back to the subpixel, and irradiate on the semiconductor photodetector. The refractive angle and reflection intensity of the light refracted and reflected from the valley lines are different from those of the light refracted and reflected from the ridge lines. This results in different number of photoelectrons produced in the semiconductor photodetector corresponding to the valley lines and the semiconductor photodetector corresponding to the ridge lines when the refracted and reflected light irradiates on the semiconductor photodetector.

In the second time period, the second transistor is switch on, the reset voltage signal sets the second polarity region (e.g., an N+ doping semiconductor region) of the semiconductor photodetector at a high voltage level, the common voltage signal sets the first polarity regions (e.g., a P+ doping semiconductor region) of the semiconductor photodetector at a low voltage level, and the semiconductor photodetector is configured to be in a reversely biased state. When the second transistor is just switch off, the voltage level between the first polarity region and the second polarity region is maintained at a certain level (i.e., the voltage difference between the reset voltage level and the common voltage level). Subsequently, the photoelectrons generated in the semiconductor photodetector then causes a reduction of voltage level between the first polarity region and the second polarity region. Different numbers of photoelectrons generated by different semiconductor photodetectors result in different degrees of voltage level reduction. When the second transistors are turned on again by the third scan signal, the remaining voltages at the plurality of second polarity regions produce a plurality of photocurrents, which are transmitted to a signal processor through the corresponding read lines. Based on these photocurrents, the signal processor is able to process the detected biometric signals from the read lines, and recognize the valley lines and ridge lines in the fingerprint.

For example, when a finger (or a palm or a foot) touches a pixel region of the array substrate containing a semiconductor photodetector in at least one subpixel, the ridge lines of the fingerprint is more likely in physical contact with the screen surface where the total reflection condition is changed locally upon touch, leading to the disruption of the total reflection locally. The disruption of the total reflection results in a reduced intensity of the light reflected by a ridge line of the fingerprint back to the subpixel. On the other hand, the light reached any valley line of the fingerprint substantially reflects back to the subpixel. This results in a light intensity difference between the light irradiating on the semiconductor photodetector corresponding to the valley lines, which in turn leads to a difference between the numbers of photoelectrons generated in the semiconductor photodetectors corresponding to the ridge lines and the valley lines, respectively, and the intensity of photocurrents detected from the semiconductor photodetectors corresponding to the ridge lines and the valley lines, respectively.

Thus, each semiconductor photodetector goes through a photoelectron accumulation period, which is between a first time point when the second transistor is turned off after the second scan signal is applied and a second time point when the second transistor is turned on by the third scan signal. During the photoelectron accumulation period, the photoelectrons generated in each semiconductor photodetector reduce the voltage level between the first polarity region and the second polarity region.

In the intermittent time period, the plurality of second scan lines simultaneously switch on the plurality of second transistors to detect the cumulative biometric signal. A human body part such as a finger, a palm, or a foot has bloodstreams that contains hemoglobin, which absorbs infrared light (e.g., near infrared light). When the human body part touch the screen, the amount of hemoglobin in the bloodstreams fluctuates pulse by pulse. Accordingly, the intensity of light (e.g., infrared light) reflected back to the semiconductor photodetector also fluctuates pulse by pulse. When a non-human object such as a stylus touches the screen, the intensity of light reflected back to the semiconductor photodetector does not fluctuate, e.g., it remains substantially unchanged during the touch event. Therefore, by measuring a plurality of cumulative biometric signals during the intermittent time period, it can be determined that whether a touch from a human user has occurred. For example, if the intensity of the cumulative biometric signals during the intermittent time period fluctuate within an upper threshold and a lower threshold, it can be determined that a human touch event has occurred. Subsequently, the frame of image may include a second time period and a third time period to detect biometric information. If the intensity of the cumulative biometric signals during the intermittent time period remains substantially unchanged over the intermittent time period, or the change exceeds the lower threshold or the upper threshold, it can then be determined that a human touch even has not occurred. Subsequently, the frame of image may omit the second time period and the third time period.

In some embodiments, each frame of image may further include other modes such as a touch mode for detecting touch events. Optionally, the array substrate further includes a plurality of touch signal lines. Each touch signal line in a touch detection time period is configured to apply a touch signal to each touch electrode for detecting a touch event at each touch electrode. Optionally, a touch area including a plurality of subpixels where the touch event is detected can be determined subsequent to the detecting step. The biometric information detection described hereinthroughout may be performed within the touch area.

In some embodiments, if a touch event is detected, the array substrate is configured to display an inserted image with equal illuminance level for each subpixel. Each first scan line in each frame of inserted image is configured to apply a fifth scan signal to each subpixel in the row of subpixels to allow a second data signal be passed from a corresponding data line to the each subpixel to produce a subpixel of image based on the second data signal. The second data signal may be equal for each subpixel.

Because the touch area has been determined, the biometric information may be conveniently detected within the touch area. Optionally, the touch detection time period is earlier in time than the first time period and the second time period. Specifically, in some embodiments, each second scan line in the second time period of each frame of image is configured to apply a second scan signal row-by-row to each second transistor in the row of the subpixels in the touch area, allowing the reset voltage signal be passed from a corresponding electrode configured to provide the reset voltage signal to each semiconductor photodetector in the touch area. The reset voltage signal is configured to set the second polarity region of the semiconductor photodetector in the touch area at a high voltage level. A common voltage signal of the common electrode sets the first polarity region of the semiconductor photodetector in the touch area at a low voltage level. The semiconductor photodetector in the touch area is configured to be in a reversely biased state. Optionally, the second time period is later in time than the touch detection time period.

Further, in some embodiments, each second scan line in the third time period of each frame of image is configured to apply a third scan signal to each second transistor in the row of the subpixels in the touch area, allowing a biometric signal to be passed from the each subpixel having the semiconductor photodetector in the touch area to a corresponding read line. Optionally, the third time period is later in time than the second time period.

The semiconductor photodetector according to the present disclosure may be made to detect various light of color, e.g., visible light, infrared light, ultraviolet light, etc. In some embodiments, the semiconductor photodetector is disposed in the intersubpixel region (e.g., the black matrix region). Optionally, the black matrix (or a portion of the black matrix corresponding to the semiconductor photodetector) is made of a material non-transparent for visible light but transparent for a non-visible light (e.g., infrared light or ultraviolet light). Optionally, the semiconductor photodetector is configured to detect the non-visible light, and optionally, the back light module is configured to emit light including the non-visible light as a component.

In some embodiments, the black matrix (or a portion of the black matrix corresponding to the semiconductor photodetector) is made of a visible light blocking material, e.g., a light filtering material including germanium or germanium oxide. The semiconductor photodetector is configured to detect light of a wavelength outside the range of visible light wavelengths.

In some embodiments, the semiconductor photodetector is configured to detect visible light. Optionally, the portion of the black matrix corresponding to the semiconductor photodetector may be made of a material transmissive for visible light. Optionally, the black matrix of the array substrate may be patterned so that an area corresponding to the semiconductor photodetector does not include a black matrix material.

Figure 3:
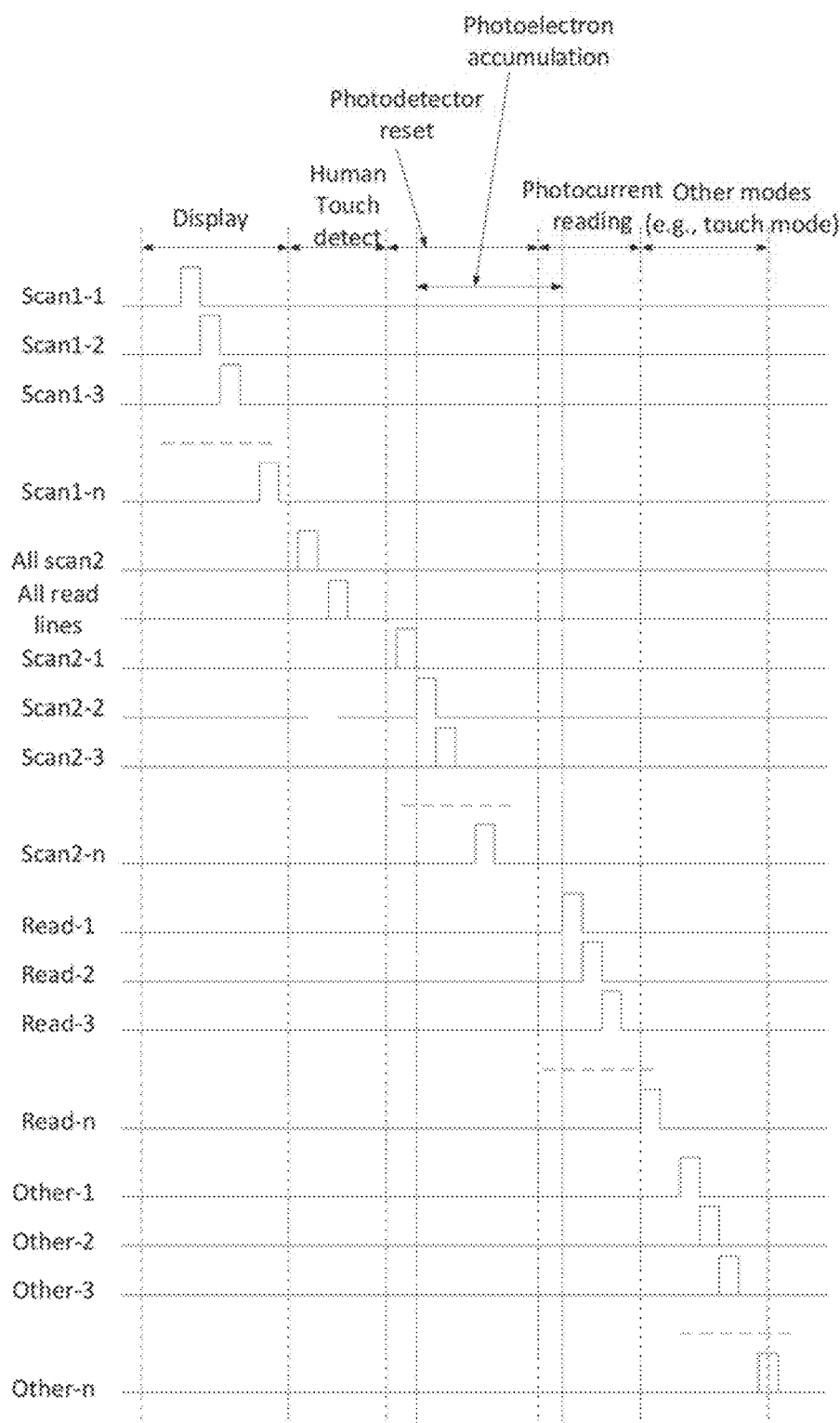
FIG. 3 is a flow chart illustrating a method for driving an operation of the array substrate in some embodiments.

In another aspect, the present disclosure provides a method for driving an operation of the array substrate described herein. FIG. 3 is a flow chart illustrating a method for driving an operation of the array substrate in some embodiments. Referring to FIG. 3, the present driving method includes a display mode, a human touch detect mode, a photodetector reset mode, a photocurrent reading mode, and optionally, other modes such as a touch mode.

In some embodiments, the driving method is implemented by providing a plurality of first scan signals to the plurality of first scan lines row-by-row in a first time period of each frame of image (e.g., corresponding to the display mode in FIG. 3). Each first scan line in the first time period applies a first scan signal to each subpixel in the row of subpixels, allowing a data signal be passed from a corresponding data line to the each subpixel to produce a subpixel of image based on the data signal.

Referring to FIG. 3, the driving method is further implemented by providing a plurality of second scan signals to the plurality of second scan lines row-by-row in a second time period of each frame of image (e.g., corresponding to photodetector reset mode) and providing a common voltage signal of the common electrode. Each second scan line in the second time period applies a second scan signal to each second transistor in the row of the subpixels, allowing the reset voltage signal be passed from a corresponding electrode configured to provide the reset voltage signal to each semiconductor photodetector. The reset voltage signal sets the second polarity region of the semiconductor photodetector at a high voltage level. The common voltage signal sets the first polarity region of the semiconductor photodetector at a low voltage level. The semiconductor photodetector is set to be in a reversely biased state. Optionally, the second time period is later in time than the first time period.

In some embodiments, the present driving method further includes providing a plurality of third scan signals to the plurality of second scan lines row-by-row in a third time period of each frame of image (e.g., corresponding to the photocurrent reading mode in FIG. 3). Each second scan line in the third time period applies a third scan signal to each second transistor in the row of the subpixels, allowing a biometric signal to be transmitted from the each subpixel having the semiconductor photodetector to a corresponding read line. Optionally, the third time period is later in time than the second time period.

In some embodiments, the present driving method further includes providing a plurality of fourth scan signals to the plurality of second scan lines simultaneously in an intermittent time period (e.g., corresponding to the human touch detect mode). The plurality of second scan lines in the intermittent time period of each frame of image applies a fourth scan signal to a plurality of second transistors in the plurality of pixel units simultaneously, allowing a plurality of biometric signals from the plurality of subpixels having the semiconductor photodetector to be transmitted to a plurality of corresponding read lines. The driving method further includes generating a cumulative biometric signal from a sum of the biometric signal from each read line.

Optionally, the intermittent time period is earlier in time than the second time period.

The above described steps of providing the plurality of fourth scan signals and generating the cumulative biometric signal may be repeated multiple times in the intermittent time period to generate a plurality of cumulative biometric signals. If the plurality of cumulative biometric signals fluctuate within an upper threshold and a lower threshold, it can be determined that a human touch event has occurred. Subsequently, the photodetector reset mode (corresponding to the second time period) and the photocurrent reading mode (corresponding to the third time period) may be implemented in the driving method to detect biometric information. If the intensity of the cumulative biometric signals during the intermittent time period remains substantially unchanged over the intermittent time period, or the change exceeds the lower threshold or the upper threshold, it can then be determined that a human touch event has not occurred. Subsequently, the photodetector reset mode (corresponding to the second time period) and the photocurrent reading mode (corresponding to the third time period) may be omitted from the driving method implementation in that particular frame of image.

Optionally, the driving method includes determining that a touch from a human user has occurred if a difference between at least two of the plurality of cumulative biometric signals is larger than a lower threshold value, and a difference between any two of the plurality of cumulative biometric signals does not exceed an upper threshold value.

Optionally, the driving method includes determining that a touch from a human user has not occurred if a difference between any two of the plurality of cumulative biometric signals does not exceed the lower threshold value, or a difference between at least two of the plurality of cumulative biometric signals is larger than the upper threshold value.

In some embodiments, the driving method further includes a touch mode. Optionally, the method further includes providing a plurality of touch signals to the plurality of touch electrodes in a touch detection time period of each frame of image. Each touch signal line in the touch detection time period applies a touch signal to each touch electrode for detecting a touch event at each touch electrode thereby determining a touch area including a plurality of subpixels where the touch event is detected. Optionally, the touch detection time period is earlier in time than the second time period and the third time period.

In some embodiments, if a touch event is detected, the array substrate is configured to display an inserted image with equal illuminance level for each subpixel. The method further includes providing a plurality of second scan signals to the plurality of second scan lines row-by-row in the second time period of each frame of image and providing a common voltage signal to the common electrode. Each second scan line in the second time period applies a second scan signal to each second transistor in the row of the subpixels in the touch area, allowing the reset voltage signal be passed from a corresponding electrode configured to provide the reset voltage signal to each semiconductor photodetector in the touch area. The reset voltage signal sets the second polarity region of the semiconductor photodetector in the touch area at a high voltage level. The common voltage signal sets the first polarity region of the semiconductor photodetector in the touch area at a low voltage level. The semiconductor photodetector in the touch area is set to be in a reversely biased state. Optionally, the second time period is later in time than the first time period.

In some embodiments, the driving method further includes providing a plurality of third scan signals to the plurality of second scan lines row-by-row in the third time period of each frame of image. Each second scan line in the third time period applies a third scan signal to each second transistor in the row of the subpixels in the touch area, allowing a biometric signal from the each subpixel having the semiconductor photodetector in the touch area to be transmitted to a corresponding read line. Optionally, the third time period is later in time than the second time period.

In another aspect, the present disclosure provides a display panel having the array substrate described herein. Optionally, the display panel is a liquid crystal display panel. Optionally, the display panel further includes a packaging substrate.

In another aspect, the present disclosure provides a display apparatus having the display panel described herein.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun, or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled is the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate for displaying a plurality of frames of image, comprising:
   a base substrate;
   an array of a plurality of pixel units on the base substrate, each pixel unit comprising at least one subpixel for image display, at least one of the plurality of pixel units comprising a semiconductor photodetector in at least one subpixel for detecting biometric information;
   a plurality of first scan lines for driving image display;

a plurality of second scan lines, each second scan line being connected to a row of subpixels having the semiconductor photodetector in a row of pixel units; and a plurality of read lines, each read line being connected to each semiconductor photodetector in a column of subpixels having the semiconductor photodetector in a column of pixel units;

wherein each subpixel in the plurality of pixel units comprises a first transistor for driving image display;

each semiconductor photodetector comprises a first polarity region connected to a common electrode in a same subpixel, and a second polarity region connected to an electrode configured to provide a reset voltage signal to the second polarity region, and a diode junction connecting the first polarity region and the second polarity region; and each subpixel having the semiconductor photodetector comprises a second transistor, the second transistor comprising a gate node connected to a corresponding second scan line, a first node connected to a corresponding read line, and a second node connected to the second polarity region directly, or indirectly through the electrode configured to provide the reset voltage signal.

2. The array substrate of claim 1, wherein the electrode configured to provide the reset voltage signal is the second node of the second transistor; the semiconductor photodetector is on a side of the second node of the second transistor distal to the base substrate; and a projection of the semiconductor photodetector in plan view of the array substrate is within a projection of the second node of the second transistor in a same subpixel.

3. The array substrate of claim 1, wherein the electrode configured to provide the reset voltage signal is an electrode in a same layer as a pixel electrode in a same subpixel; and the semiconductor photodetector is on a side of the electrode distal to the base substrate.

4. The array substrate of claim 3, wherein each subpixel having the semiconductor photodetector further comprises a light shield layer on a side of the electrode proximal to the base substrate; and a projection of the semiconductor photodetector in plan view of the array substrate is within a projection of the light shield layer in a same subpixel.

5. The array substrate of claim 3, wherein each pixel unit comprises a subpixel region and an inter-subpixel region, and a single semiconductor photodetector in each pixel unit is configured to span over portions of inter-subpixel regions of at least two subpixels in each pixel unit.

6. The array substrate of claim 3, wherein each pixel unit comprises a subpixel region and an inter-subpixel region, and a single semiconductor photodetector in each pixel unit is configured to span over portions of inter-subpixel regions of all subpixels in each pixel unit.

7. The array substrate of claim 1, wherein the plurality of first scan lines is configured to drive the plurality of pixel units row-by-row in a first time period; each first scan line in the first time period of each frame of image of the plurality of frames of image is configured to apply a first scan signal to each subpixel in the row of subpixels to allow a data signal to be passed from a corresponding data line to the each subpixel in the row of subpixels to produce a subpixel of an image based on the data signal;

the plurality of second scan lines is configured to drive the plurality of pixel units row-by-row in a second time period; each second scan line in the second time period of each frame of image of the plurality of frames of image is configured to apply a second scan signal to each second transistor in the row of the subpixels to allow the reset voltage signal to be passed from a corresponding electrode configured to provide the reset voltage signal to each semiconductor photodetector; the reset voltage signal being configured to set the second polarity region of the semiconductor photodetector at a high voltage level, the common electrode being configured to apply a common voltage signal to set the first polarity region of the semiconductor photodetector at a low voltage level, and the semiconductor photodetector being configured to be in a reversely biased state; the second time period being later in time than the first time period; and the plurality of second scan lines is configured to drive the plurality of pixel units row-by-row in a third time period; each second scan line in the third time period of each frame of image of the plurality of frames of image is configured to apply a third scan signal to each second transistor in the row of the subpixels to transmit a biometric signal from the each subpixel in the row of subpixels having the semiconductor photodetector to a corresponding read line; the third time period being later in time than the second time period.

8. The array substrate of claim 7, wherein the plurality of second scan lines is configured to drive the plurality of pixel units simultaneously in an intermittent time period; the plurality of second scan lines in the intermittent time period of each frame of image of the plurality of frames of image is configured to apply a fourth scan signal to a plurality of second transistors in the plurality of pixel units simultaneously to transmit a plurality of biometric signals from the plurality of subpixels having the semiconductor photodetector to a plurality of corresponding read lines; and a sum of the biometric signal from each read line forms a cumulative biometric signal.

9. The array substrate of claim 8, wherein the intermittent time period is earlier in time than the second time period.

10. The array substrate of claim 8, wherein the plurality of second scan lines in the intermittent time period of each frame of image of the plurality of frames of image is configured to apply the fourth scan signal multiple times.

11. The array substrate of claim 7, wherein each data line connected to the column of subpixels having the semiconductor photodetector is used as a read line for the column of subpixels having the semiconductor photodetector in the third time period, and used as a data line in the first time period.

12. The array substrate of claim 1, wherein the semiconductor photodetector is a PN photodiode, the first polarity region is a P+doping semiconductor region, and the second polarity region is an N+doping semiconductor region.

13. The array substrate of claim 1, wherein the semiconductor photodetector is a PIN photodiode, the first polarity region is a P+doping semiconductor region, the second polarity region is an N+doping semiconductor region, and the PIN photodiode further comprises an intrinsic region of amorphous silicon between the P+doping semiconductor region and the N+doping semiconductor region.

14. The array substrate of claim 1, wherein each pixel unit comprises a subpixel region and an inter-subpixel region, and the semiconductor photodetector is within the inter-subpixel region.

15. A display panel, comprising the array substrate of claim 1.

16. A display apparatus, comprising the display panel of claim 15.

17. A method for driving an operation of an array substrate for displaying a plurality of frames of image:
wherein the array substrate comprises:
a base substrate;
an array of a plurality of pixel units on the base substrate, each pixel unit comprising at least one subpixel for image display, at least one of the plurality of pixel units comprising a semiconductor photodetector in at least one subpixel for detecting biometric information;
a plurality of first scan lines for driving image display;
a plurality of second scan lines, each second scan line being connected to a row of subpixels having the semiconductor photodetector in a row of pixel units; and
a plurality of read lines, each read line being connected to each semiconductor photodetector in a column of subpixels having the semiconductor photodetector in a column of pixel units;
wherein each subpixel in the plurality of pixel units comprises a first transistor for driving image display;
each semiconductor photodetector comprises a first polarity region connected to a common electrode in a same subpixel, and a second polarity region connected to an electrode configured to provide a reset voltage signal to the second polarity region, and a diode junction connecting the first polarity region and the second polarity region; and
each subpixel having the semiconductor photodetector comprises a second transistor, the second transistor comprising a gate node connected to a corresponding second scan line, a first node connected to a corresponding read line, and a second node connected to the second polarity region directly, or indirectly through the electrode configured to provide the reset voltage signal,
wherein the method comprises:
providing a plurality of first scan signals to the plurality of first scan lines row-by-row in a first time period of each frame of image of the plurality of frames of image; each first scan line in the first time period applies a first scan signal to each subpixel in the row of subpixels to allow a data signal to be passed from a corresponding data line to the each subpixel in the row of subpixels to produce a subpixel of an image based on the data signal;
providing a plurality of second scan signals to the plurality of second scan lines row-by-row in a second time period of each frame of image of the plurality of frames of image and providing a common voltage signal to the common electrode; each second scan line in the second time period applies a second scan signal to each second transistor in the row of the subpixels to allow the reset voltage signal to be passed from a corresponding electrode configured to provide the reset voltage signal to each semiconductor photodetector; the reset voltage signal sets the second polarity region of the semiconductor photodetector at a high voltage level, the common voltage signal sets the first polarity region of the semiconductor photodetector at a low voltage level, and the semiconductor photodetector is set to be in a reversely biased state; the second time period being later in time than the first time period; and
providing a plurality of third scan signals to the plurality of second scan lines row-by-row in a third time period of each frame of image of the plurality of frames of image; each second scan line in the third time period applies a third scan signal to each second transistor in the row of the subpixels to transmit a biometric signal from the each subpixel in the row of subpixels having the semiconductor photodetector to a corresponding read line; the third time period being later in time than the second time period.

18. The method of claim 17, further comprising:
providing a plurality of fourth scan signals to the plurality of second scan lines simultaneously in an intermittent time period; the plurality of second scan lines in the intermittent time period of each frame of image of the plurality of frames of image applies a fourth scan signal to a plurality of second transistors in the plurality of pixel units simultaneously to transmit a plurality of biometric signals from the plurality of subpixels having the semiconductor photodetector to a plurality of corresponding read lines; and
generating a cumulative biometric signal from a sum of the biometric signal from each read line.

19. The method of claim 18, wherein the intermittent time period is earlier in time than the second time period.

20. The method of claim 18, further comprising:
repeating the step of providing the plurality of fourth scan signals and the step of generating the cumulative biometric signal multiple times in the intermittent time period, thereby generating a plurality of cumulative biometric signals; and
determining that a touch from a human user has occurred if a difference between at least two of the plurality of cumulative biometric signals is larger than a lower threshold value, and a difference between any two of the plurality of cumulative biometric signals does not exceed an upper threshold value.

* * * * *